United States Patent [19]

Simonsen et al.

[11] Patent Number: 5,561,734
[45] Date of Patent: Oct. 1, 1996

[54] DIAL SPEED CONTROL FOR HAND-HELD POWER TOOL

[75] Inventors: Glenn H. Simonsen, Brookfield; Michael E. Bauer, Hartland, both of Wis.

[73] Assignee: Milwaukee Electric Tool Corporation, Brookfield, Wis.

[21] Appl. No.: 929,101

[22] Filed: Aug. 13, 1992

[51] Int. Cl.$^6$ ................................................ H02P 7/00
[52] U.S. Cl. .................................................. 388/838
[58] Field of Search ..................... 388/937, 807, 388/824, 827, 838; 338/160–164, 184, 199, 312; 81/469, 57, 11

[56] References Cited

U.S. PATENT DOCUMENTS

| | | | |
|---|---|---|---|
| 3,172,070 | 3/1965 | Hardison et al. | 338/184 X |
| 3,355,693 | 11/1967 | Benthuysen et al. | 338/184 |
| 3,611,095 | 10/1971 | Schnizler | 388/937 |
| 3,909,769 | 9/1975 | Rozena et al. | 338/163 X |
| 4,410,846 | 10/1983 | Gerber | 388/937 X |
| 4,427,966 | 1/1984 | Gratzinger et al. | 338/199 X |
| 4,810,993 | 3/1989 | Vermeulen | 338/162 |

OTHER PUBLICATIONS

Sales Brochure of Kautt & Bux titled "Control Electronics", 1989.

*Primary Examiner*—Anthony Wysocki
*Attorney, Agent, or Firm*—Michael, Best & Friedrich

[57] ABSTRACT

An electric tool including a variable speed switch assembly including a potentiometer having a central rotatable member defining a bore with a noncircular cross section and a molded plastic speed control wheel housing the potentiometer. The speed control wheel includes a central post with a cross section corresponding to the cross section of the central potentiometer bore such that the central post can be housed in the central bore in only one relative position with respect to the central rotatable member. The variable speed switch assembly also includes a switch cover having projections which snap into designated holes provided in a circuit board such that the switch cover and the circuit cannot be incorrectly assembled. The switch cover includes a stop member that extends into a semi-circular recess in the speed control wheel to provide mechanical stops so that rotational movement of the speed control wheel corresponds with the range of the potentiometer. The variable speed switch assembly also incorporates a detent arrangement integrated into the switch cover and the speed control wheel and including a resilient finger, the end of which is received in a series of detent grooves in the speed control wheel to maintain the speed control wheel in a desired angular position corresponding to a desired speed setting.

16 Claims, 3 Drawing Sheets

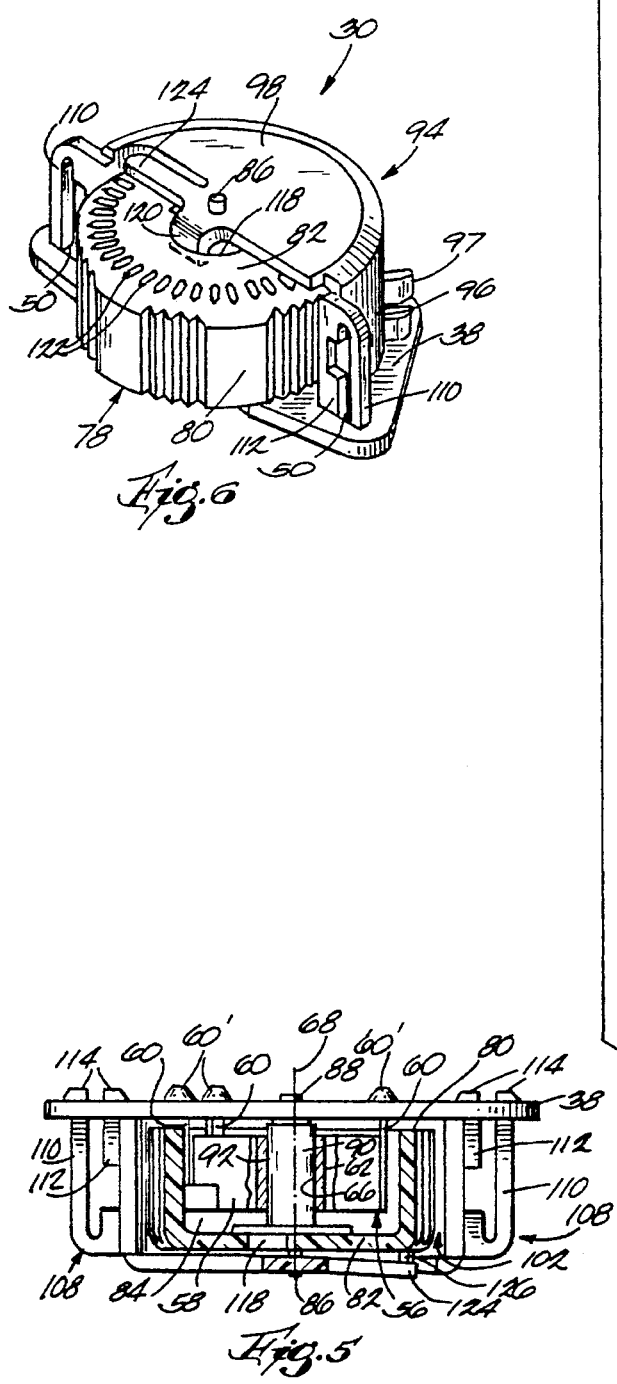

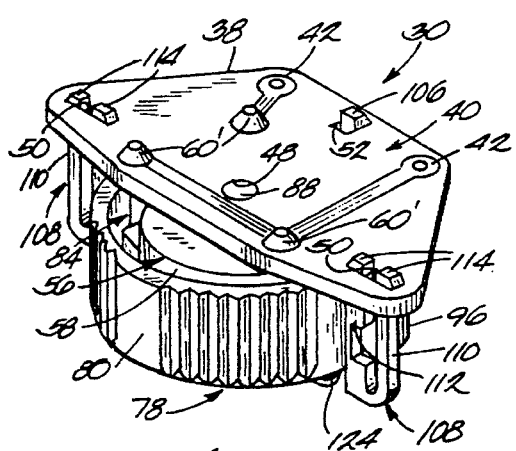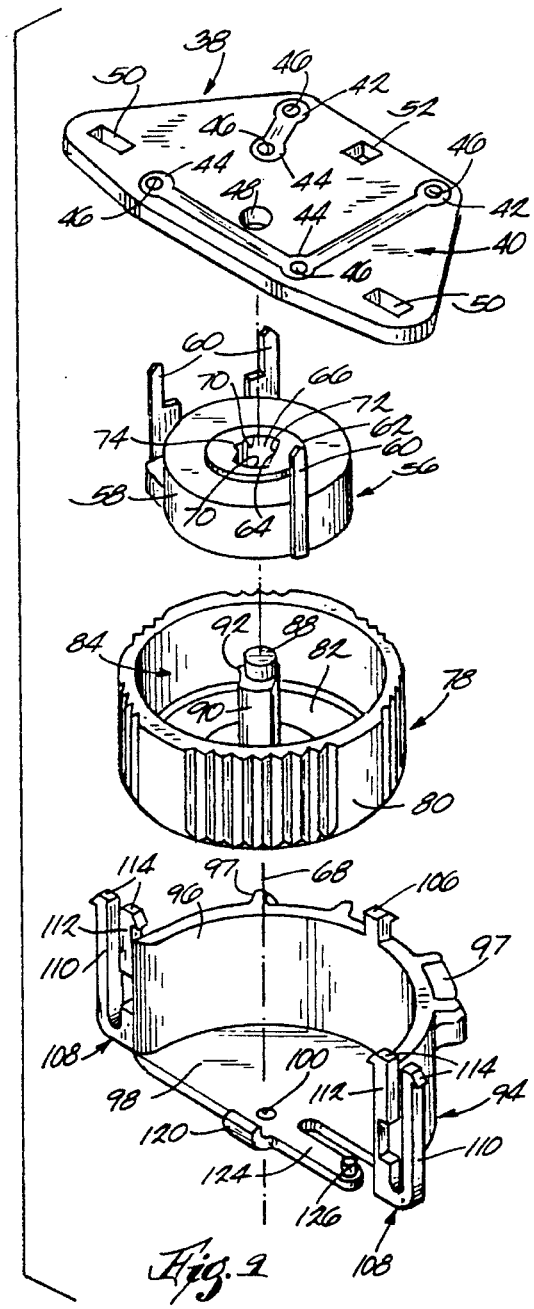

DIAL SPEED CONTROL FOR HAND-HELD POWER TOOL

BACKGROUND OF THE INVENTION

1. Field of the Invention

The invention relates generally to electric power tools, and more particularly to power tools equipped with variable speed switches for varying tool speed.

2. Reference to Prior Art

In some power tools, tool speed can be varied by controlling the pressure applied to the trigger. However, varying trigger pressure may not be an acceptable way to vary tool speed since holding a trigger in a less than fully depressed position causes fatigue and accurate trigger control is difficult.

It is known to provide electric tools with slide switches to vary tool speed when the trigger of the tool is fully depressed. However, a slide switch only provides an operator with a choice of high and low speeds.

It is also known to provide an electric tool with a variable speed switch which is useful regardless of power line voltage and which employs a potentiometer that is adjustable with a thumb wheel to control tool speed. Thumb wheel adjustment permits an operator to simply dial in a desired tool speed when the trigger is fully depressed. Prior art variable speed switch assemblies include multiple components and considerable care must be exercised to insure that the components are properly assembled to form the switch unit. Some of these components, such as the thumb wheel for example, must be made of costly heat resistant materials to withstand the temperatures generated when the potentiometer is soldered to a circuit board. Furthermore, care must be taken to avoid damaging prior art switch assemblies through normal use. For example, mechanical stops within the potentiometer absorb energy exerted by an operator when the thumb wheel reaches the limits of potentiometer adjustment range.

SUMMARY OF THE INVENTION

The invention provides an electric tool having an improved variable speed switch assembly which is compact and durable and which can be easily assembled with a minimum number of economical components that facilitate virtually mistake-proof assembly.

More particularly, the variable speed switch assembly is supported on the body of an electric tool and is electrically connected to the tool motor to selectively control tool speed. The variable speed switch assembly includes a potentiometer having contacts soldered to a circuit board and a central rotatable member defining a bore having a noncircular cross section. The variable speed switch assembly also includes a molded plastic speed control wheel housing the potentiometer. The speed control wheel includes a central post with a cross section corresponding to the cross section of the central potentiometer bore such that the central post can be housed in the central bore in only one relative position with respect to the central rotatable member. This prevents the speed control wheel from being incorrectly assembled on the potentiometer. By manually dialing the speed control wheel an operator can vary the resistance provided by the potentiometer to set a desired operating speed range for the tool.

The variable speed switch assembly also includes a switch cover having projections which snap into designated holes provided in the circuit board such that the switch cover and the circuit cannot be incorrectly assembled. The switch cover houses the speed control wheel to provide a compact assembly and the speed control wheel is journaled on the switch cover and the circuit board for rotation. The switch cover includes a stop member that extends into a semi-circular recess in the speed control wheel. The stop member and the recess cooperate to provide mechanical stops so that rotational movement of the speed control wheel corresponds with the range of the potentiometer. The mechanical stops prevent the stops in the potentiometer from absorbing significant mechanical energy to improve the durability of the potentiometer. The variable speed switch assembly also includes a detent arrangement which is integrated into the switch cover and the speed control wheel to reduce the number of separate parts used in the switch assembly. The detent arrangement includes a resilient finger, the end of which is received in a series of detent grooves in the speed control wheel to maintain the speed control wheel in a desired angular position corresponding to a desired speed setting.

The variable speed switch assembly is easily assembled by first mounting the potentiometer on the circuit board. This is preferably accomplished by soldering potentiometer contacts to the circuit board. The speed control wheel is then mounted on the potentiometer and the switch cover is snapped onto the circuit board over the speed control wheel and the potentiometer. Since the speed control wheel and the switch cover are not assembled in the switch assembly until after the potentiometer is soldered to the circuit board, inexpensive, non-heat resistant plastics can be used for these components.

Other features and advantages of the invention will become apparent to those skilled in the art upon review of the following detailed description, claims and drawings.

BRIEF DESCRIPTION OF THE DRAWINGS

FIG. 5 is a cross-sectional view of the switch assembly taken along line 5—5 in FIG. 2.

FIG. 6 is a perspective view of the switch assembly illustrated in FIG. 2.

FIG. 7 is an exploded view of the switch assembly illustrated in FIG. 6.

FIG. 8 is a reverse perspective view of the switch assembly illustrated in FIG. 2.

FIG. 9 is an exploded view of the switch assembly illustrated in FIG. 8.

Figure 1:
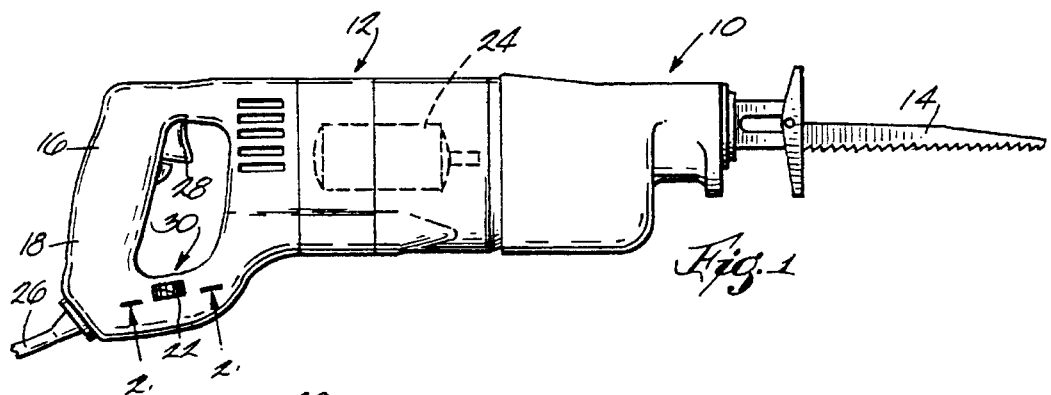
FIG. 1 is a side elevational view of a hand-held electric power tool including a variable speed switch assembly embodying the invention.

Before one embodiment of the invention is explained in detail, it is to be understood that the invention is not limited in its application to the details of construction and the arrangement of components set forth in the following description or illustrated in the drawings. The invention is capable of other embodiments and of being practiced or being carried out in various ways. Also, it is to be understood that phraseology and terminology used herein is for the purpose of the description and should not be regarded as limiting.

GENERAL DESCRIPTION

Figure 2:
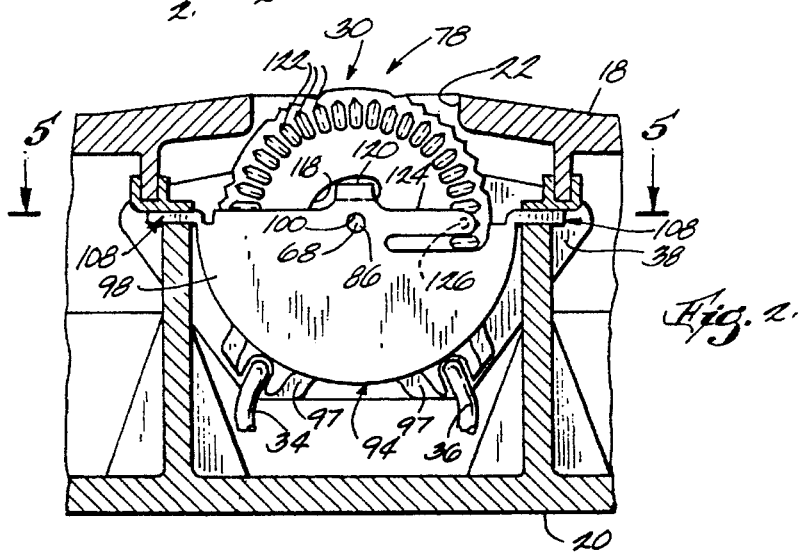
FIG. 2 is an enlarged view taken along line 2—2 in FIG. 1 and showing the switch assembly in plan view.
Figure 3:
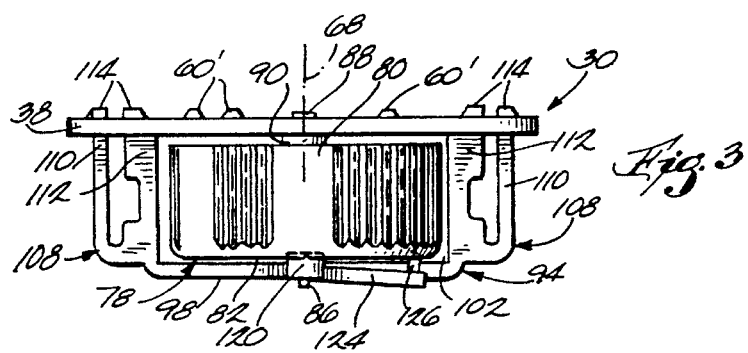
FIG. 3 is a side elevational view of the switch assembly illustrated in FIG. 2.
Figure 4:
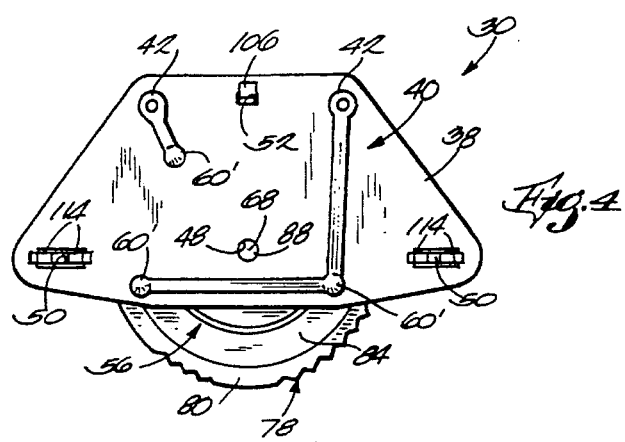
FIG. 4 is a reverse plan view of the switch assembly illustrated in FIG. 2.

Illustrated in FIG. 1 is a power tool including a variable speed switch assembly embodying the invention. While the variable speed switch assembly could be used in other power tools and in other applications, in the illustrated arrangement, the power tool is a hand-held electric reciprocating saw 10 including a molded housing or tool body 12 supporting a reciprocable saw blade 14. The tool body 12 includes a handle 16 having opposite right and left handle sections 18 and 20, respectively (FIG. 2). The right handle section 18 includes an aperture 22 adjacent its lower end.

The reciprocating saw 10 also includes an electric motor 24 (shown schematically) housed in the tool body 12 and an electric power cord 26 extending from the handle 16 to connect the reciprocating saw 10 to a remote electrical power source (not shown). A manually operable trigger 28 is provided on the handle 16 and, when depressed, closes the contacts of a variable speed or on/off switch (not shown) to provide electric power to the motor 24.

To selectively vary the speed of operation of the motor 24, the reciprocating saw 10 includes a variable speed switch assembly 30 which acts in conjunction with a remote electronic circuit forming part of the overall tool circuit. As shown in FIG. 2, the switch assembly 30 is mounted in the handle 16 between the right and left handle sections 18 and 20 and is accessible through the aperture 22 in the handle 16. Electrical leads 34 and 36 are provided to connect the switch assembly 30 in series relation in a tool electrical circuit including the aforementioned trigger-actuated switch and the motor 24.

The illustrated switch assembly 30 (FIGS. 2–6 and 8) comprises four components, the first of which is a printed circuit board 38. As shown with reference to FIGS. 7 and 9, the circuit board 38 includes an electrical circuit 40 (FIG. 9) having a set of ring-shaped first terminals 42 (two are shown) and a set of ring-shaped second terminals 44 (three are shown). To facilitate various electrical connections to the first and second terminals 42 and 44, the circuit board 38 is provided with a plurality of holes 46 (FIG. 7) coextensive with the ring-shaped first and second terminals 42 and 44 and arranged in a predetermined pattern. To facilitate various non-electrical connections, the circuit board 38 is also provided with a circular central opening 48, a pair of rectangular openings 50, and a generally square opening 52. The openings 48, 50 and 52 are also arranged in a predetermined pattern.

The second component of the switch assembly 30 is a potentiometer 56. As shown in FIGS. 7 and 9, the potentiometer 56 includes a cylindrical body 58 which houses a conventional variable resistance circuit including three axially extending metal contacts 60. Each of the contacts 60 extends through a designated one of the holes 46 in the circuit board 38 and is soldered to one of the second terminals 44, as indicated by reference numerals 60' (See FIGS. 4 and 8), to mount the potentiometer 56 on the circuit board 38 and to electrically connect the potentiometer 56 to the electric circuit 40. The leads 34 and 36 extend through the two remaining holes 46 in the circuit board 38 and are electrically connected to the first terminals 42 to electrically connect the switch assembly circuit in series relation with the larger tool circuit as mentioned above.

The potentiometer 56 also includes mechanical means for varying the resistance provided by the potentiometer 56. While various means for varying resistance can be employed, in the illustrated arrangement, such means includes a central member 62 supported on the potentiometer body 58 for rotation relative thereto through an angular range defined between internal stops (not shown) in the potentiometer body 58. With reference to FIGS. 7 and 9, the central member 62 includes an inner surface 64 defining a central bore 66 having a central longitudinal axis 68 such that the central bore 66 is coaxial with the potentiometer body 58 and the central opening 48 in the circuit board 38. The central bore 66 has a noncircular cross section. In the illustrated arrangement, the cross section of the central bore 66 is formed by opposite generally arcuate inner surface portions 70 and opposite generally planar inner surface portions 72 to give the central bore 66 a double D-shaped cross section. Additionally, one of the planar inner surface portions 72 is provided with an axially extending keyway 74.

The switch assembly 30 also includes as its third component a manually operable speed control wheel 78 which is preferably integrally molded of plastic. The speed control wheel 78 includes a cylindrical outer wall 80 and an end wall 82 which together form a hollow shell defining a cavity 84 that houses the potentiometer body 58. The speed control wheel 78 also includes a boss 86 projecting from the outside surface of the end wall 82 and a central post 88 extending from the inside surface of the end wall 82 coaxially with the boss 86. As shown in FIG. 5, the central post 88 extends through the central bore 66 and into the central opening 48 in the circuit board 38. The central post 86 includes a portion 90 which is housed in the central bore 66 and which, like the central bore 66, has a noncircular cross section that in the illustrated arrangement is substantially identical to the double D-shaped cross section of the central bore 66. This post portion 90 also includes an axially extending key 92 that is received in the keyway 74 in the central bore 66. The noncircular portion 90 of the central post 88 and the central bore 66 of the potentiometer 56 cooperate to interconnect the speed control wheel 78 and the central member 62 of the potentiometer 56 for common rotation. Thus, the speed control wheel 78 is operably connected to the potentiometer 56 such that rotation of the speed control wheel 78 by an operator is effective to vary the resistance provided by the potentiometer 56 to thereby control the operating speed of the motor 24.

The switch assembly 30 further includes as its fourth component a switch cover 94 which is also preferably integrally molded of plastic. As shown with reference to FIGS. 7 and 9, the switch cover 94 includes an arcuate wall portion 96 provided with clips 97 to accommodate the leads 34 and 36 (FIG. 2) and a semicircular wall portion 98. The semicircular wall portion 98 has a central support hole 100 through which the boss 86 on the speed control wheel 78 extends. The switch cover 94 and the circuit board 38 define therebetween a space 102 housing the speed control wheel 78 which is generally fixed within the space 102 against substantial nonrotational movement by the boss 86 and the central post 88.

The switch cover 94 also includes means for releasably attaching the switch cover 94 in snap-fit relation on the circuit board 38. While various attaching means can be employed, in the illustrated arrangement such means includes a rear snap projection 106 extending from the edge of the arcuate wall portion 96 through the square opening 52 in the circuit board 38. The attaching means also includes a pair of dual snap arrangements 108 extending radially outwardly from the diametrically opposite ends of the annular wall portion 96. Each of the dual snap arrangements 108 includes spaced apart resilient arms 110 and 112 having snap projections 114 at their distal ends. The arms 110 and 112 of each snap arrangement 108 extend through one of the rectangular openings 50 in the circuit board 38.

To prevent the aforementioned stops within the potentiometer 56 from absorbing mechanical energy applied by an operator via the speed control wheel 78, means for limiting rotational movement of the speed control wheel 78 with respect to the circuit board 38 are provided. While various rotational movement limiting means can be employed, in the illustrated arrangement such means includes a C-shaped recess (FIG. 7) formed in the speed control wheel 78 and a projection or stop member 120 (FIGS. 7 and 9) extending from the switch cover 94. The stop member 120 is housed in the C-shaped recess 118 (See FIG. 6). When the central potentiometer member 62 is rotated via the speed control wheel 78 to a position nearing the end of its angular range, the stop member 120 engages an end of the C-shaped recess 118 to prevent further rotation of the speed control wheel 78.

The switch assembly 30 is also provided with means for forming a detent between the speed control wheel 78 and the switch cover 94. While various detent forming means can be employed, in the illustrated arrangement such means includes a plurality of circumferentially arranged detent grooves 122 formed in the outside surface of the end wall 82 of the speed control wheel 78 and a resilient projection or finger extending from the wall portion 98 of the switch cover 94. The resilient finger 124 includes a detent peg 126 (FIG. 9) on the outer end thereof. The detent peg 126 is biased into engagement with respective ones of the detent grooves 122 (see FIG. 3) to restrict rotation of the speed control wheel 78 with respect to the switch cover 94 to maintain the speed control wheel 78 in a desired angular position corresponding to a desired resistance value. Additionally, the tactile and audible "clicks" produced by engagement between the detent peg 126 and successive detent grooves 122 assist an operator in accurately and quickly dialing in a desired resistance setting.

The four previously described interrelating components are easily assembled to form the switch assembly 30. In a preferred method of assembly, the potentiometer 56 is first mounted on the circuit board 38 by inserting the metal contacts 60 through the designated holes 46 in the circuit board 38 and then soldering (preferably using a wave soldering technique) the contacts 60 to the second terminals 44 on circuit board 38. The speed control wheel 78 is then mounted on the potentiometer 56 by inserting the central post 88 into the central bore 66 of the potentiometer after first aligning the noncircular portion 90 of the central post 88 with the noncircular central bore 66 so that the key 92 fits into the keyway 74. The noncircular cross sections of the central post 88 and the central bore 66 enable the central post 88 to be housed in the central bore 66 in only one relative position with respect to the central potentiometer member 62. In this regard, the interaction of the key 92 and keyway 74 prevent the speed control wheel 78 and the central potentiometer member 62 from being assembled 180° out of phase relative to one another.

After mounting the speed control wheel 78 on the potentiometer 56, the switch cover 94 is mounted on the circuit board 38 by aligning the rear snap projection 106 and the dual snap arrangements 108 with the square opening 52 and the rectangular openings 50, respectively. The switch cover 94 is then pressed against the circuit board 38 so that the snap projections 106 and 114 snap outwardly to their original positions after clearing the circuit board 38 to releasably secure the switch cover 94 on the circuit board 38. In this assembled position the boss 86 fits in the support hole 100 in the switch cover 94.

While in the illustrated arrangement the switch assembly 30 is shown as incorporated in a reciprocating saw 10, it should be understood that a switch assembly 30 embodying the invention can be employed in any electrical tool in which dial speed control of the motor is desired.

Advantageously, the switch assembly 30 of the present invention includes only four components that can be easily and quickly assembled in automatically aligned and properly positioned relation to one another to enable virtually mistake-proof assembly. The switch assembly 30 is also a more economical unit since the potentiometer 56 is soldered to the circuit board 38 prior to assembling the speed control wheel 78 and the switch cover 94 on the unit so that the speed control wheel 78 and the switch cover 94 can be molded of relatively inexpensive plastics. In prior art arrangements plastic components are assembled prior to the soldering operation, thereby necessitating the use of more expensive, heat resistant plastic materials. Additionally, the detent mechanism (i.e. resilient finger 124 with detent peg 126 and detent grooves 122) is formed integrally with the speed control wheel 78 and the switch cover 94 so that the detent mechanism is automatically operably engaged following assembly of the switch assembly 30. Still further, the cooperating noncircular cross sections of the noncircular portion 90 of the central post 88 and the central bore 66 of the potentiometer 56 prevent the speed control wheel 78 from being assembled in incorrect angular relation to the potentiometer 56. Thus when the switch cover is snapped onto the circuit board 38 the stop member 120 is automatically housed in its appropriate position in the C-shaped recess 118 to accurately correspond to the angular position of the central potentiometer member 62 to provide positive stops such that the internal stops in the potentiometer 56 are protected, thereby increasing the durability of the switch assembly 30.

Various features of the invention are set forth in the following claims.

We claim:

1. A variable speed switch assembly for use in an electric tool to control the speed of operation of the electric tool, the variable speed switch assembly comprising:

a printed circuit board including an electric circuit, a potentiometer mounted on the circuit board and electrically connected to the electric circuit of the circuit board, the potentiometer including a body and a central rotatable member supported by the body and including a central bore having a central axis, the central rotatable member being rotatable about the central axis, a hollow speed control wheel housing the potentiometer, the speed control wheel including a central post housed in the central bore of the central rotatable member, and the speed control wheel being manually operable to rotate the central rotatable member about the central axis with respect to the body of the potentiometer, and a switch cover mounted on the circuit board, the switch cover and the circuit board defining a space therebetween, the space housing the speed control wheel, and the switch cover including means for limiting rotational movement of the speed control wheel with respect to the circuit board.

2. A variable speed switch assembly as set forth in claim 1 wherein the switch cover is mounted in a snap fit relation on the circuit board, and wherein the switch cover is formed of molded plastic and includes at least one projection extending through the circuit board to releasably attach the switch cover to the circuit board.

3. A variable speed switch assembly as set forth in claim 1 wherein the means for limiting rotational movement of the speed control wheel with respect to the circuit board includes a projection extending from one of the switch cover and the speed control wheel and a recess formed in the other of the switch cover and the speed control wheel, the recess housing the projection and permitting only limited movement of the speed control wheel with respect to the switch cover.

4. A variable speed switch assembly as set forth in claim 1 wherein the speed control wheel is formed of molded plastic.

5. A variable speed switch assembly as set forth in claim 1 wherein the central bore of the central rotatable member has a noncircular cross section such that the central post of the speed control wheel can be housed in the central bore in only one relative position with respect to the central rotatable member.

6. A variable speed switch assembly for use in an electric tool to control the speed of operation of the electric tool, the variable speed switch assembly comprising:
   a printed circuit board including an electric circuit,
   a potentiometer mounted on the circuit board and electrically connected to the electric circuit of the circuit board, the potentiometer including a body and a central rotatable member supported by the body and including a central bore having a central axis and a noncircular cross section, the central rotatable member being rotatable about the central axis,
   a hollow speed control wheel housing the potentiometer and including a central post housed in the central bore of the central rotatable member, the central post having a cross section which permits the central post to be housed in the central bore in only one relative position with respect to the central rotatable member, the speed control wheel being manually operable to rotate the central rotatable member about the central axis with respect to the body of the potentiometer, and
   means for limiting rotational movement of the speed control wheel with respect to the circuit board.

7. A variable speed switch assembly as set forth in claim 6 and further including a molded plastic switch cover mounted in a snap fit relation on the circuit board, the switch cover including at least one projection extending through the circuit board to releasably attach the switch cover to the circuit board, and the switch cover and the circuit board defining a space therebetween, the space housing the speed control wheel.

8. A variable speed switch assembly as set forth in claim 6 wherein the means for limiting rotational movement of the speed control wheel with respect to the circuit board includes a projection extending from one of the switch cover and the speed control wheel and a recess formed in the other of the switch cover and the speed control wheel, the recess housing the projection and permitting only limited movement of the speed control wheel with respect to the switch cover.

9. An electric tool comprising:
   a tool body,
   an electric motor housed in the tool body, and
   a speed control switch assembly supported by the tool body and electrically connected to the electric motor for controlling the speed of operation of the electric motor, the speed control switch assembly including a printed circuit board including an electric circuit, a potentiometer mounted on the circuit board and electrically connected to the electric circuit of the circuit board, the potentiometer including a body and a central rotatable member supported by the body and including a central bore having a central axis, the central rotatable member being rotatable about the central axis, a hollow speed control wheel housing the potentiometer, the speed control wheel including a central post housed in the central bore of the central rotatable member, and being manually operable to rotate the central rotatable member about the central axis with respect to the body of the potentiometer, and a switch cover mounted on the circuit board, the switch cover and the circuit board defining a space therebetween, the space housing the speed control wheel, and the switch cover including means for limiting rotational movement of the speed control wheel with respect to the circuit board.

10. An electric tool as set forth in claim 9 wherein the switch cover is mounted in a snap fit relation on the circuit board, and wherein the switch cover is formed of molded plastic and includes at least one projection extending through the circuit board to releasably attach the switch cover to the circuit board.

11. An electric tool as set forth in claim 9 wherein the means for limiting rotational movement of the speed control wheel with respect to the circuit board includes a projection extending from one of the switch cover and the speed control wheel and a recess formed in the other of the switch cover and the speed control wheel, the recess housing the projection and permitting only limited movement of the speed control wheel with respect to the switch cover.

12. An electric tool as set forth in claim 9 wherein the central bore of the central rotatable member has a noncircular cross section such that the central post of the speed control wheel can be housed in the central bore in only one relative position with respect to the central rotatable member.

13. A variable speed switch assembly as set forth in claim 1 wherein the switch cover is mounted in snap fit relation on the circuit board, and wherein the circuit board includes a plurality of openings, and the switch cover includes a plurality of projections that correspond with the openings in the circuit board such that the switch cover can be snapped onto the circuit board in only one position with respect to the circuit board.

14. A variable speed switch assembly for use in an electric tool to control the speed of operation of the electric tool, the variable speed switch assembly comprising:
   a printed circuit board including an electric circuit,
   a potentiometer mounted on the circuit board and electrically connected to the electric circuit of the circuit board, the potentiometer including a body and a central rotatable member supported by the body and including a central bore having a central axis, the central rotatable member being rotatable about the central axis,
   a speed control wheel including a central post housed in the central bore of the central rotatable member, the speed control wheel being manually operable to rotate the central rotatable member about the central axis with respect to the body of the potentiometer, and
   a switch cover mounted on the circuit board, the switch cover and the circuit board defining a space therebetween, the space housing the speed control wheel, and the switch cover including means for limiting rotational movement of the speed control wheel with respect to the circuit board, and means for forming a detent between the switch cover and the speed control wheel, the means for forming the detent including a plurality of spaced apart grooves formed in one of the speed control wheel and the switch cover, and a resilient projection extending from the other of the speed control wheel and the switch cover, the projection being engageable with respective ones of the grooves to restrict rotation of the speed control wheel with respect to the switch cover.

15. A variable speed switch assembly for use in an electric tool to control the speed of operation of the electric tool, the variable speed switch assembly comprising:

a printed circuit board including an electric circuit, a potentiometer mounted on the circuit board and electrically connected to the electric circuit of the circuit board, the potentiometer including a body and a central rotatable member supported by the body and including a central bore having a central axis and a noncircular cross section, the central rotatable member being rotatable about the central axis, a hollow speed control wheel housing the potentiometer and including a central post housed in the central bore of the central rotatable member, the central bore having a cross section which permits the central post to be housed in the central bore in only one relative position with respect to the central rotatable member, the speed control wheel being manually operable to rotate the central rotatable member about the central axis with respect to the body of the potentiometer, means for limiting rotational movement of the speed control wheel with respect to the circuit board, and means for forming a detent between the switch cover and the speed control wheel, the means for forming the detent including a plurality of spaced apart grooves formed in one of the speed control wheel and the switch cover, and a resilient projection extending from the other of the speed control wheel and the switch cover, the projection being engageable with respective ones of the recesses to restrict rotation of the speed control wheel with respect to the switch cover.

16. An electric tool comprising:

a tool body, an electric motor housed in the tool body, and a speed control switch assembly supported by the tool body and electrically connected to the electric motor for controlling the speed of operation of the electric motor, the speed control switch assembly including a printed circuit board including an electric circuit, a potentiometer mounted on the circuit board and electrically connected to the electric circuit of the circuit board, the potentiometer including a body and a central rotatable member supported by the body and including a central bore having a central axis, the central rotatable member being rotatable about the central axis, a speed control wheel including a central post housed in the central bore of the central rotatable member, the speed control wheel being manually operable to rotate the central rotatable member about the central axis with respect to the body of the potentiometer, a switch cover mounted on the circuit board, the switch cover and the circuit board defining a space therebetween, the space housing the speed control wheel, and the switch cover including means for limiting rotational movement of the speed control wheel with respect to the circuit board, and means for forming a detent between the switch cover and the speed control wheel, the means for forming a detent including a plurality of spaced apart grooves formed in one of the speed control wheel and the switch cover, and a resilient projection extending from the other of the speed control wheel and the switch cover, the projection being engageable with respective ones of the recesses to restrict rotation of the speed control wheel with respect to the switch cover.

* * * * *